United States Patent
Fu et al.

(10) Patent No.: US 12,219,388 B2
(45) Date of Patent: Feb. 4, 2025

(54) METHOD FOR ETHERNET FRAME TRANSMISSION, METHOD FOR ETHERNET FRAME RECEPTION, COMPRESSOR, AND DECOMPRESSOR

(71) Applicant: GUANGDONG OPPO MOBILE TELECOMMUNICATIONS CORP., LTD., Guangdong (CN)

(72) Inventors: Zhe Fu, Guangdong (CN); Qianxi Lu, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 348 days.

(21) Appl. No.: 17/660,616

(22) Filed: Apr. 25, 2022

(65) Prior Publication Data
US 2022/0256399 A1    Aug. 11, 2022

Related U.S. Application Data (63) Continuation of application No. PCT/CN2020/072516, filed on Jan. 16, 2020.

(51) Int. Cl.
*H04W 28/06* (2009.01)
(52) U.S. Cl.
CPC ................ *H04W 28/06* (2013.01)
(58) Field of Classification Search
CPC .................................................. H04W 28/06
See application file for complete search history.

(56) References Cited

U.S. PATENT DOCUMENTS

| 2005/0090273 | A1  | 4/2005 | Jin et al.              |
|--------------|-----|--------|-------------------------|
| 2006/0083183 | A1  | 4/2006 | Teague et al.           |
| 2019/0116521 | A1* | 4/2019 | Qiao ........... H04W 28/06 |
| 2020/0259896 | A1* | 8/2020 | Sachs ........... H04W 12/04 |
| 2021/0112449 | A1* | 4/2021 | Joseph ......... H04W 28/06 |

FOREIGN PATENT DOCUMENTS

| CN | 101371552 A | 2/2009 |
| CN | 101453298 A | 6/2009 |
| CN | 102420672 A | 4/2012 |
| CN | 105337711 A | 2/2016 |
| CN | 105765929 A | 7/2016 |
| CN | 108512576 A | 9/2018 |

(Continued)

OTHER PUBLICATIONS

Brief Communication issued in corresponding EP application No. 20913501.1 dated Dec. 22, 2023. 5 pages.

(Continued)

*Primary Examiner* — Duc C Ho
(74) *Attorney, Agent, or Firm* — PERKINS COIE LLP (57) ABSTRACT

A method for Ethernet frame transmission, a method for Ethernet frame reception, a compressor, and a decompressor are disclosed in the disclosure. The method includes transmitting, by a compressor, a first Ethernet frame to a decompressor, where a header of the first Ethernet frame carries first information, and the first information is used to indicate to the decompressor whether to perform context establishment, and/or, whether to perform feedback transmission.

12 Claims, 5 Drawing Sheets

```
COMPRESSOR                                          DECOMPRESSOR

202, Transmit a first Ethernet frame;
      (carrying first information, where the first
   information is used to indicate to the decompressor
    whether to perform context establishment and/or
         whether to perform feedback transmission)

204, Receive the first Ethernet
                                                        frame
```

(56) References Cited

FOREIGN PATENT DOCUMENTS

WO 2009074101 A1 6/2009

OTHER PUBLICATIONS

ZTE Corporation et al: "Remaining issues for EHC in TSC", 3GPP TSG-RAN WG2#108; R2-1915615, Nov. 18-22, 2019. 4 pages.
Samsung: "EHC header handling for IIoT", 3GPP TSG RAN WG2 Meeting #107bis; R2-1912528, dated Oct. 14-18, 2019. 3 pages.
Ericsson: "Ethernet header compression", 3GPP TSG-RAN WG2#107bis; R2-1912553, dated Oct. 14-18, 2019. 8 pages.
Huawei: "(TP for NR BL CR for TS 38.463): on corrections of ROHC parameters over E1", 3GPP TSG-RAN WG3 Meeting #101bis; R3-185997, dated Oct. 8-12, 2018. 4 pages.
Extended European search report issued in corresponding European application No. 20913501.1 dated Sep. 27, 2022. 11 pages.
First Examination Report issued in corresponding Indian application No. 202227027997 dated Sep. 29, 2022. 6 pages with English translation.
3GPP TS 38.323 V16.4.0, dated Jun. 2021—3rd Generation Partnership Project; Technical Specification Group Radio Access Network; NR; Packet Data Convergence Protocol (PDCP) specification (Release 16). (40 pages).
3GPP TSG-RAN WG2 Meeting #107bis—R2-1913644—Qualcomm Incorporated, Principles for EHC header design, dated Oct. 18, 2019. (3 pages).
3GPP TSG-RAN WG2 Meeting#108—R2-1915907—LG Electronics Inc., Discussion on EHC feedback, dated Nov. 22, 2019. (2 pages).
TSG-RAN2 meeting#106—R2-1905648—ZTE Corporation, Ethernet header compression in TSC for NR-IIOT, dated May 17, 2019. (4 pages).
3GPP TSG-RAN2 Meeting#107bis—R2-1913265—Mediatek Inc., Ethernet Header Compression Message Format, dated Oct. 18, 2019. (7 pages).
International search report issued in corresponding international application No. PCT/CN2020/072516 dated Oct. 20, 2020. (12 pages).
Vivo, 3GPP TSG-RAN WG2 Meeting #107bis, R2-1912312, "Email discussion summary on EHC", Oct. 14-18, 2019. 38 pages. Retrieved from: https://www.3gpp.org/ftp/TSG_RAN/WG2_RL2/TSGR2_107bis/Docs/R2-1912312.zip.
Huawei, HiSilicon, 3GPP TSG-RAN WG2 Meeting #107bis, R2-1913473, "Discussion on EHC header format", Oct. 14-18, 2019. 4 pages. Retrieved from: https://www.3gpp.org/ftp/TSG_RAN/WG2_RL2/TSGR2_107bis/Docs/R2-1913473.zip.
Examination Report issued in corresponding EP application No. 20913501.1 dated May 9, 2023. 8 pages.
CATT, 3GPP TSG-RAN WG2 Meeting #108, R2-1914410, "Discussion on Ethernet Header Compression", Nov. 18-22, 2019. 5 pages. Retrieved from: https://www.3gpp.org/ftp/TSG_RAN/WG2_RL2/TSGR2_108/Docs/R2-1914410.zip.
The first office action issued in corresponding CN application No. CN202210663052.1 dated Jun. 16, 2023. 14 pages with English translation.
Summons to Oral Proceedings issued in corresponding EP application No. 20913501.1 dated Aug. 28, 2023. 7 pages.
Notification of grant of patent right for invention issued in corresponding CN application No. 202210663052.1 dated Sep. 26, 2023. 9 pages with English translation.

\* cited by examiner

METHOD FOR ETHERNET FRAME TRANSMISSION, METHOD FOR ETHERNET FRAME RECEPTION, COMPRESSOR, AND DECOMPRESSOR

CROSS-REFERENCE TO RELATED APPLICATION(S)

This application is a continuation of International Application No. PCT/CN2020/072516, filed on Jan. 16, 2020, the entire disclosure of which is hereby incorporated by reference.

TECHNICAL FIELD

The disclosure relates to the field of wireless communication, and more particularly to a method for Ethernet frame transmission, a method for Ethernet frame reception, a compressor, and a decompressor.

BACKGROUND

In the 5th generation industrial internet of things (5G IIoT), transmission of services in a 5G system, such as factory automation, transport industry, electrical power distribution, or the like, is required to be supported. Based on transmission requirements of latency and reliability, a concept of time sensitive network (TSN) or time sensitive content (TSC) is introduced in 5G IIoT, and header compression is required to be performed on TSN services. TSC services can be carried by Ethernet frames or internet protocol (IP) packets.

The topic of Ethernet frame is introduced because in a conventional communication system header compression can be performed only on a data packet whose corresponding protocol data unit (PDU) session is an IP packet. However, in a 5G new radio (NR) system, a PDU session type may be an IP packet type or an Ethernet frame type.

How to perform header compression on Ethernet frames in a reasonable manner is an urgent technical problem to be solved.

SUMMARY

A method for Ethernet frame transmission, a method for Ethernet frame reception, a compressor, and a decompressor are provided in implementations of the disclosure.

According to an aspect of the disclosure, a method for Ethernet frame transmission is provided. The method is applied to a compressor and includes transmitting a first Ethernet frame to a decompressor, where a header of the first Ethernet frame carries first information, and the first information is used to indicate to the decompressor whether to perform context establishment and/or whether to perform feedback transmission.

According to another aspect of the disclosure, a method for Ethernet frame reception is provided. The method is applied to a decompressor and includes receiving a first Ethernet frame transmitted by a compressor, where a header of the first Ethernet frame carries first information, and the first information is used to indicate to the decompressor whether to perform context establishment and/or whether to perform feedback transmission.

According to an aspect of the disclosure, a compressor is provided. The compressor includes a transceiver configured to transmit a first Ethernet frame to a decompressor, where a header of the first Ethernet frame carries first information, and the first information is used to indicate to the decompressor whether to perform context establishment and/or whether to perform feedback transmission.

According to an aspect of the disclosure, a decompressor is provided. The decompressor includes a transceiver configured to receive a first Ethernet frame transmitted by a compressor, where a header of the first Ethernet frame carries first information, and the first information is used to indicate to the decompressor whether to perform context establishment and/or whether to perform feedback transmission.

BRIEF DESCRIPTION OF THE DRAWINGS

In order to illustrate technical solutions in implementations of the disclosure more clearly, the following will give a brief introduction to the accompanying drawings required for illustrating implementations. Apparently, the accompanying drawings hereinafter illustrated are merely some implementations of the disclosure. Based on these drawings, those of ordinary skill in the art can also obtain other drawings without creative effort.

DETAILED DESCRIPTION

In order to make purposes, technical solutions, and advantages of the disclosure clearer, the following will further illustrate in detail implementations of the disclosure with reference to the accompanying drawings.

First of all, briefly introduce nouns involved in implementations of the disclosure.

Header compression: header compression refers to compress a header of a data packet to improve transmission efficiency of user data. At present, in long-term evolution (LTE) and new radio (NR), a header of a data packet is compressed with robust header compression (ROHC) at a packet data convergence protocol (PDCP).

Packet data unit (PDU) session type: a PDU session refers to an association between a user equipment (UE) and a data network (DN) that provides a PDU connection service. A type of the association may be internet protocol version 4 (IPv4), internet protocol version 6 (IPv6), Ethernet, or the like.

Full packet: a full packet refers to an Ethernet frame, where the frame includes full Ethernet header information, context information, or the like. The context information is used for header compression and/or decompression.

Compressed packet: a compressed packet refers to an Ethernet frame, where the frame includes compressed Ethernet header information (including no header information), context information, or the like. The context information is used for header compression and/or decompression.

Feedback packet: a feedback packet refers to a packet related to decompression or context information transmitted by a decompressor to a compressor, where the packet is used to change status of the compressor or status of the decompressor.

"Frame" and "packet" herein can be understood as the same meaning, for which usual expressions are reserved in the field for ease of understanding.

Figure 1:
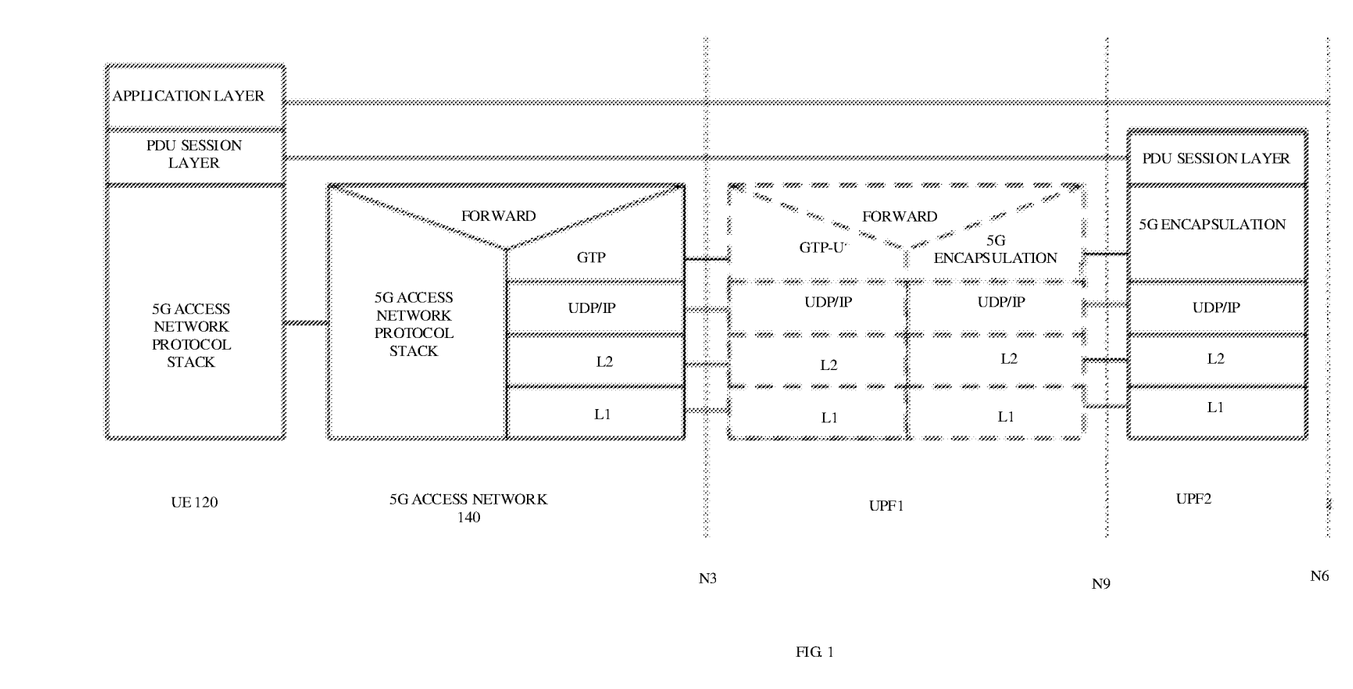
FIG. 1 is a block diagram illustrating a communication system provided in an exemplary implementation of the disclosure.

FIG. 1 is a block diagram illustrating a communication system provided in an exemplary implementation of the disclosure. The communication system includes a UE 120, a 5th generation (5G) access network 140, a user plane function (UPF) 1, and a UPF 2.

A PDU session is established between the UE 120 and the UPF 2, where the UPF 2 may be a UPF at a DN side. The PDU session corresponds to an IPv4 data packet, an IPv6 data packet, or both an IPv4 data packet and an IPv6 data packet when a type of the PDU session is IPv4, IPv6, or IPv4v6, and the PDU session corresponds to an Ethernet frame when the type of the PDU session is Ethernet.

The 5G access network 140 and the UPF 1 located between the UE 120 and the UPF 2 are used to forward, between the UE 120 and the UPF 2, a data packet or an Ethernet frame based on the PDU session.

General packet radio system (GPRS) tunneling protocol user plane (GTP-U): the protocol supports to multiplex traffic in different PDU sessions by tunneling user data through an N3 interface in a backbone network. The GTP may encapsulate all user PDUs. The layer further carries marks associated with quality of service (QoS) flows.

5G encapsulation: this layer supports to multiplex traffic of different PDU sessions (possibly corresponding to different PDU session types) at an N9 interface (i.e., between different UPFs of the 5GC). The layer further carries marks associated with QoS flows.

A data radio bearer (DRB) (not illustrated in the drawings) is established between the UE 120 and the 5G access network 140.

Optionally, the UE 120 is configured with a compressor, and the UPF 2 is configured with a decompressor. Alternatively, the UE 120 is configured with a decompressor, and the UPF 2 is configured with a compressor.

Ethernet header compression (EHC): use a new header compression mechanism to perform header compression on a header of an Ethernet frame. The header compression mechanism is an ROHC mechanism and supports status switching based on feedback. Specifically, EHC is a mechanism that a compressor switches from full packet transmission to compressed packet transmission according to feedback.

In the related art, conclusions for the EHC mechanism include the following.

1. EHC is configured as per DRB, separately for uplink (UL) and downlink (DL).

2. Context identifier (CID) concept is used, such that a compressor and a decompressor can associate a CID with Ethernet header contents.

3. Compression is done with the following principles.

3.1. For an Ethernet flow resulting in creation of a new context, the compressor transmits at least one Ethernet frame with a full header and a CID, to establish a context in the decompressor.

3.2. After above, the compressor starts compressed packet transmission. For further study (FFS) if multiple transmission and/or feedback is needed.

4. An EHC header format is designed to include the following mandatory fields: a CID, an indication of a header format (i.e., a full header or a compressed header), or FFS other fields, e.g., a profile ID.

5. An EHC function is in a PDCP.

6. An EHC header is located after a service data adaptation protocol (SDAP) header and ciphered.

7. EHC can remove the following fields: a source/destination address and a type, and EHC does not support multiple formats.

8. FFS, pad removal.

9. For context establishment, the compressor transmits the full header and the CID via a PDCP data PDU.

10. ROHC and EHC are independent, e.g., they can both be configured for a DRB from a specification point of view.

11. FFS, explicit feedback is transmitted via a PDCP control PDU if context establishment is required.

12. For context establishment, the decompressor transmits the explicit feedback to the compressor after context establishment, i.e., when the decompressor receives a full header with a CID.

13. For context establishment, the explicit feedback includes the CID.

14. When the compressor receives the feedback, the compressor determines that the context is successfully established at the decompressor. And from this time, an Ethernet frame with a compressed header can be transmitted.

As can be known from the above content, for a data bearer configured with EHC, the decompressor is required to establish a context and/or transmit feedback. However, in a DRB, compression is not required in some conditions, e.g., no CID can be allocated to other Ethernet flows when CIDs are used up, or some Ethernet flows have less Ethernet frames, then computational overheads for header compression is relatively great. In these conditions, the decompressor in the related art is also required to establish a corresponding context and perform feedback, however, these operations are not needed, resulting in increment in additional storage overheads and network overheads.

Therefore, an indication mechanism is provided in implementations of the disclosure. According to the indication mechanism, a compressor indicates to a decompressor that header compression is not required to be performed on a corresponding Ethernet frame, where the header compression includes at least one of establishing no context or performing no feedback.

Figure 2:
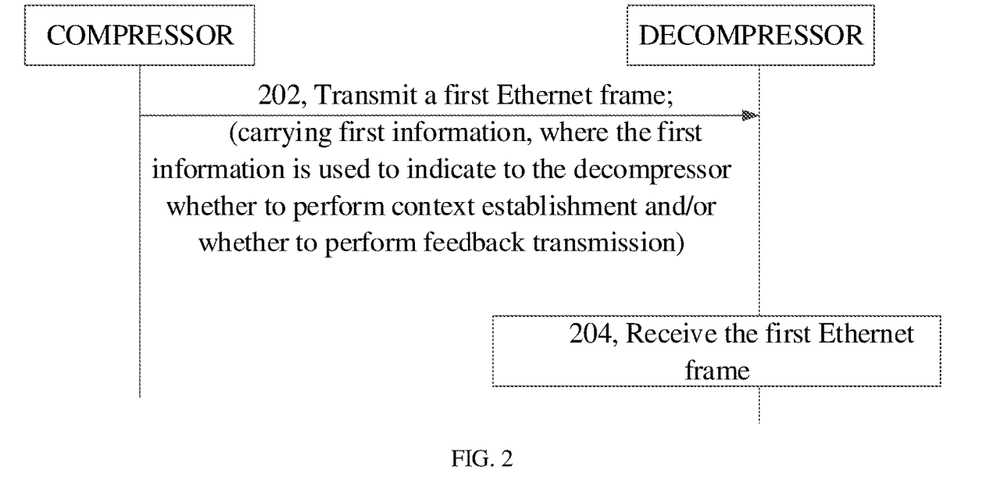
FIG. 2 is a flow chart illustrating a method for Ethernet frame transmission provided in an exemplary implementation of the disclosure.

FIG. 2 is a flow chart illustrating a method for Ethernet frame transmission provided in an exemplary implementation of the disclosure. The method is applied to a compressor and a decompressor and includes the following.

At 202, the compressor transmits a first Ethernet frame, where a header of the first Ethernet frame carries first information, and the first information is used to indicate to the decompressor whether to perform context establishment and/or whether to perform feedback transmission.

In a possible design, the first information occupies 1 bit, where the 1 bit may be any bit or a bit in a specified position in the header of the first Ethernet frame. Optionally, the first information is used to indicate to the decompressor the following.

1. Whether the decompressor performs context establishment.

If a value of the first information is a first value, it is indicated that the decompressor is required to establish a context. If the value of the first information is a second value, it is indicated that the decompressor is not required to establish a context.

2. Whether the decompressor is required to perform feedback transmission.

If the value of the first information is the first value, it is indicated that the decompressor is required to transmit feedback. If the value of the first information is the second value, it is indicated that the decompressor is not required to transmit feedback.

3. Whether the decompressor performs context establishment and whether the decompressor is required to perform feedback transmission.

If the value of the first information is the first value, it is indicated that the decompressor is required to establish a context and transmit feedback. If the value of the first information is the second value, it is indicated that the decompressor is not required to establish a context and transmit feedback.

Exemplarily, for example, the first information is used to indicate that no feedback is required to be transmitted. For another example, the first information is used to indicate that a context is required to be established and no feedback is required to be transmitted. For one more example, the first information is used to indicate that no context is required to be established and no feedback is required to be transmitted.

In another possible design, the first information occupies 2 bits, where a first bit of the 2 bits is used to indicate to the decompressor whether to establish a context, and a second bit of the 2 bits is used to indicate to the decompressor whether feedback is required to be transmitted. Exemplarily, if a value of the first bit is the first value, it is indicated that the decompressor is required to establish a context. If the value of the first bit is the second value, it is indicated that the decompressor is not required to establish a context. If a value of the second bit is the first value, it is indicated that the decompressor is required to transmit feedback. If the value of the second bit is the second value, it is indicated that the decompressor is not required to transmit feedback.

At 204, the decompressor receives the first Ethernet frame, where the header of the first Ethernet frame carries the first information, and the first information is used to indicate to the decompressor whether to perform context establishment and/or whether to perform feedback transmission.

The decompressor obtains the first information by analyzing the first Ethernet frame. Optionally, the decompressor further determines the following according to the first information.

1. Whether the decompressor performs context establishment.

2. Whether the decompressor is required to perform feedback transmission.

3. Whether the decompressor performs context establishment and whether the decompressor is required to perform feedback transmission.

For example, the decompressor determines, according to the first information, that no feedback is required to be transmitted. For another example, the decompressor determines, according to the first information, that a context is required to be established and no feedback is required to be transmitted. For one more example, the decompressor determines, according to the first information, that no context is required to be established and no feedback is required to be transmitted.

As mentioned above, in the method provided in the implementation, the first Ethernet frame is transmitted by the compressor to the decompressor, and the first information in the first Ethernet frame is used to indicate to the decompressor, such that the decompressor can determine whether the first Ethernet frame is required to be compressed, thus header compression can distinctively be or not be performed on different Ethernet frames in a same bearer. For some Ethernet frames on which header compression is not required to be performed, the decompressor is not required to establish a context and/or transmit feedback, saving storage resources and network resources of the decompressor.

Figure 3:
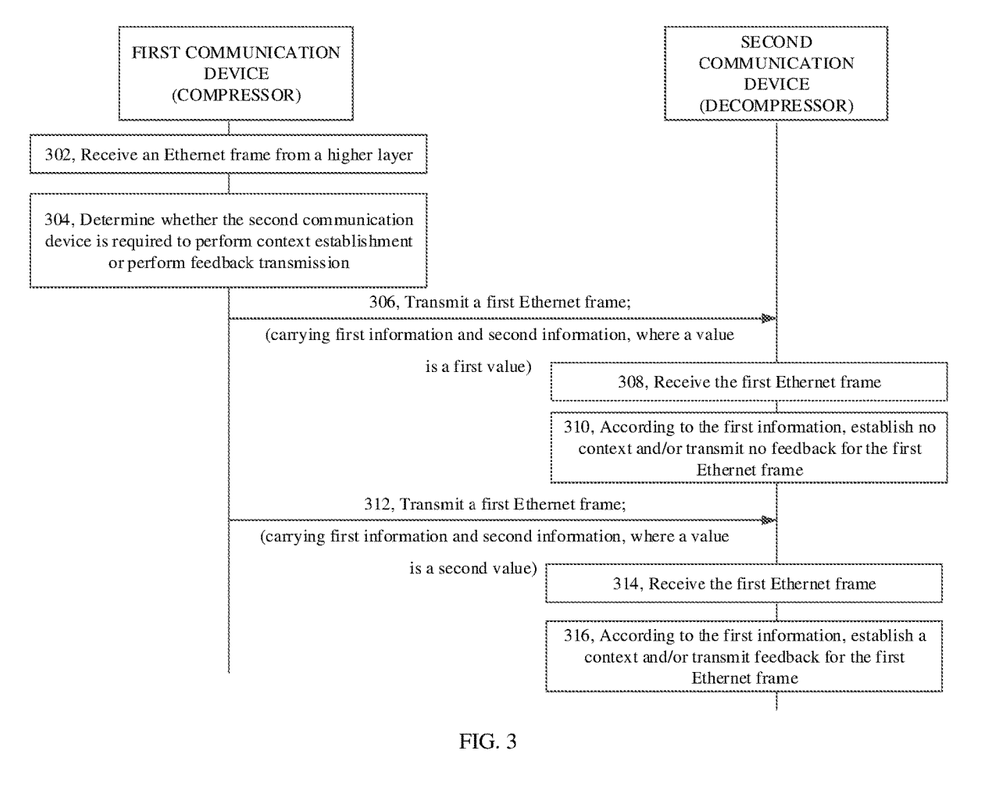
FIG. 3 is a flow chart illustrating a method for Ethernet frame transmission provided in an exemplary implementation of the disclosure.

FIG. 3 is a flow chart illustrating a method for Ethernet frame transmission provided in another exemplary implementation of the disclosure. The method is applied to a first communication device and a second communication device, where the first communication device (also called transmitting device) runs with a compressor, and the second communication device (also called receiving device) runs with a decompressor. The method includes the following.

At 302, the first communication device receives an Ethernet frame from a higher layer.

Exemplarily, a network device may pre-transmit configuration information to the first communication device. The configuration information is used to configure the first communication device to perform header compression on an Ethernet frame in a DRB, which is simplified as EHC. The DRB may be DRB1.

The first communication device may receive the Ethernet frame from the higher layer, where the Ethernet frame can also be called an Ethernet packet or an Ethernet data frame. The Ethernet frame is transmitted by the first communication device via DRB1 to the second communication device.

At 304, the first communication device determines whether the second communication device is required to perform context establishment or perform feedback transmission.

The first communication device determines whether header compression is required to be performed on the Ethernet frame. In an example, when CIDs in DRB1 are used up, the first communication device determines that header compression is not required to be performed on the Ethernet frame. In another example, when a same data flow has less Ethernet frames, the first communication device determines that header compression is not required to be performed on the Ethernet frame. In a yet another example, when the CIDs are not used up and a same data flow has greater Ethernet frames, the first communication device determines that header compression is required to be performed on the Ethernet frame.

Perform operations at 306 when header compression is not required to be performed on the Ethernet frame, and perform operations at 312 when header compression is required to be performed on the Ethernet frame.

At 306, the first communication device transmits a first Ethernet frame, where a header of the first Ethernet frame carries first information and second information, and the first information is used to indicate that no context is to be established, and/or, no feedback is required to be transmitted. The first communication device transmits the first Ethernet frame to the second communication device. The header of the first Ethernet frame carries the first information and the second information.

In the operations at 306, the first information is used to indicate that no context is to be established, no feedback is required to be transmitted, or both no context is to be established and no feedback is required to be transmitted. In the implementation, the first information being used to indicate that the decompressor is not required to establish a context and transmit feedback is taken as an example for illustration. In this case, a value of the first information is a first value, and in an example, the first value is 1.

The second information includes a reserved bit, an indication indicating whether the first Ethernet frame is a compressed packet, and a CID.

In an example, the header of the first Ethernet frame includes 3 bytes (used to carry the first information and/or the second information), where each byte includes 8 bits, totally 24 bits. The first information occupies 1 bit, the reserved bit occupies 1 bit, the indication indicating whether the first Ethernet frame is a compressed packet occupies 1 bit, and the CID occupies 21 bits. That is, the second information occupies 23 bits.

In another example, the header of the first Ethernet frame includes 2 bytes (used to carry the first information and/or the second information), where each byte includes 8 bits, totally 16 bits. The first information occupies 1 bit, the reserved bit occupies 1 bit, the indication indicating whether the first Ethernet frame is a compressed packet occupies 1 bit, and the CID occupies 13 bits. That is, the second information occupies 15 bits.

In a yet another example, the header of the first Ethernet frame includes 1 byte (used to carry the first information and/or the second information), where each byte includes 8 bits, totally 8 bits. The first information occupies 1 bit, the reserved bit occupies 1 bit, the indication indicating whether the first Ethernet frame is a compressed packet occupies 1 bit, and the CID occupies 5 bits. That is, the second information occupies 7 bits.

Optionally, the first Ethernet frame is a full packet, and the header of the first Ethernet frame is a full header. The full header further includes other header information besides the first information and the second information, e.g., a source address, a destination address, or the like, where the other header information includes compressible information.

In the operations at 306, "the indication indicating whether the first Ethernet frame is a compressed packet" in the above second information is used to indicate that the first Ethernet frame is not a compressed packet but a full packet.

At 308, the second communication device receives the first Ethernet frame.

The second communication device receives the first Ethernet frame transmitted by the first communication device. The second communication device obtains the first information in the header of the first Ethernet frame. The value of the first information is the first value.

At 310, according to the first information, the second communication device establishes no context and/or transmits no feedback for the first Ethernet frame.

In an example, the first information indicates that no context is to be established and no feedback is required to be transmitted, and then for the first Ethernet frame, the decompressor in the second communication device is not required to establish a context, transmit feedback, and perform decompressing (recovers from a compressed packet to a full packet).

Optionally, the second communication device ignores the second information when the value of the first information is the first value, or the second communication device ignores the CID in the second information when the value of the first information is the first value.

At 312, the first communication device transmits a first Ethernet frame, where a header of the first Ethernet frame carries first information and second information, and the first information is used to indicate that a context is to be established, and/or, feedback is required to be transmitted. The first communication device transmits the first Ethernet frame to the second communication device. The header of the first Ethernet frame carries the first information and the second information.

In the operations at 312, the first information is used to indicate that a context is to be established, feedback is required to be transmitted, or both a context is to be established and feedback is required to be transmitted. In the implementation, the first information being used to indicate that the decompressor is required to establish a context and transmit feedback is taken as an example for illustration. In this case, a value of the first information is a second value, and in an example, the second value is 0.

A structure of the second information is illustrated as the operations at 306, which will not be repeated herein.

Optionally, the first Ethernet frame is a full packet, and the header of the first Ethernet frame is a full header. The full header further includes other header information besides the first information and the second information, e.g., a source address, a destination address, or the like, where the other header information includes compressible information.

In the operations at 312, "the indication indicating whether the first Ethernet frame is a compressed packet" in the above second information is used to indicate that the first Ethernet frame is not a compressed packet but a full packet.

At 314, the second communication device receives the first Ethernet frame.

The second communication device receives the first Ethernet frame transmitted by the first communication device. The second communication device obtains the second information in the header of the first Ethernet frame. The value of the second information is the second value.

At 316, according to the first information, the second communication device establishes a context and/or, transmits feedback for the first Ethernet frame.

In an example, the first information indicates that a context is to be established and feedback is required to be transmitted, and then the decompressor in the second communication device is required to establish the context and transmit the feedback for the first Ethernet frame.

The header of the first Ethernet frame further includes the other header information since the header of the first Ethernet frame is the full header. The second communication device obtains the other header information, and according to the other header information, establishes the context and transmits the feedback for the first Ethernet frame. The feedback is used to trigger the first communication device to start switching from full packet transmission status to compress packet transmission status.

During subsequent compressed packet transmission, a header of a subsequent Ethernet frame is a compressed header. "The indication indicating whether the first Ethernet frame is a compressed packet" in the second information is used to indicate that a header of a current Ethernet frame is a compressed packet.

As mentioned above, in the method provided in the implementation, the first Ethernet frame is transmitted by the compressor to the decompressor, and the first information in the first Ethernet frame is used to indicate to the decompressor, such that the decompressor can determine whether the first Ethernet frame is required to be compressed, thus header compression can distinctively be or not be performed on different Ethernet frames in a same bearer. For some Ethernet frames on which header compression is not required to be performed, the decompressor is not required to establish a context and/or transmit feedback, saving storage resources and network resources of the decompressor.

The implementation can be divided into three implementations as follows according to whether the first information and the second information are carried.

1. The header of the Ethernet frame can only carry the first information and no second information, e.g., the implementation as illustrated in FIG. 2.

2. The header of the Ethernet frame carries both the first information and the second information, e.g., the implementation as illustrated in FIG. 3.

3. The header of the Ethernet frame can only carry the second information and no first information. For the third implementation, reference can be made to an implementation as illustrated in FIG. 4.

Figure 4:
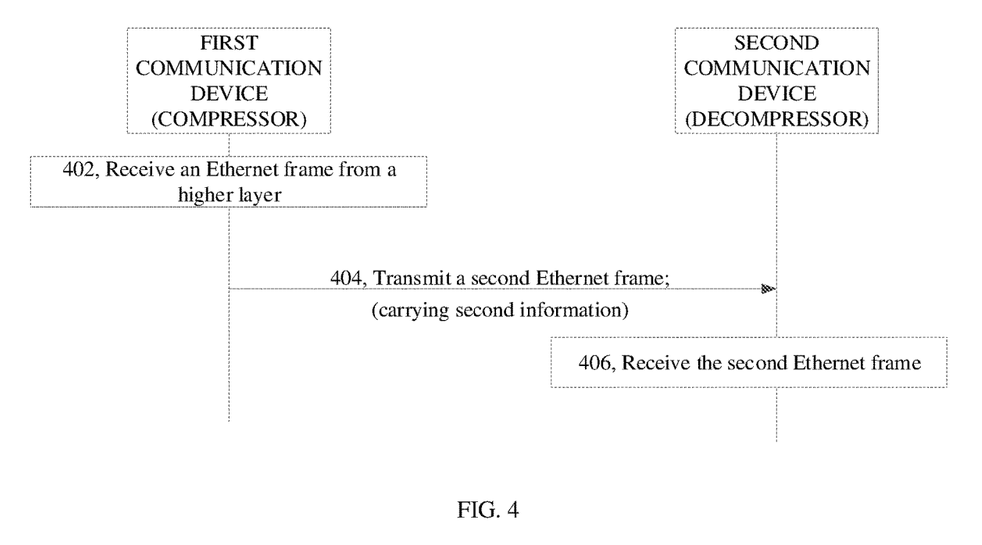
FIG. 4 is a flow chart illustrating a method for Ethernet frame transmission provided in another exemplary implementation of the disclosure.

FIG. 4 is a flow chart illustrating a method for Ethernet frame transmission provided in an exemplary implementation of the disclosure. The method is applied to a first communication device and a second communication device, where the first communication device (also called transmitting device) runs with a compressor, and the second communication device (also called receiving device) runs with a decompressor. The method includes the following.

At 402, the first communication device receives an Ethernet frame from a higher layer.

Exemplarily, a network device may pre-transmit configuration information to the first communication device. The configuration information is used to configure the first communication device to perform header compression on an Ethernet frame in DRB1, which is simplified as EHC.

The first communication device may receive the Ethernet frame from the higher layer, where the Ethernet frame can also be called an Ethernet packet or an Ethernet data frame. The Ethernet frame is transmitted by the first communication device via DRB1 to the second communication device.

At 404, the first communication device transmits a second Ethernet frame, where a header of the second Ethernet frame carries second information.

The first communication device transmits the second Ethernet frame to the second communication device. The header of the second Ethernet frame carries the second information.

In the operations at 404, the second information includes a reserved bit, an indication indicating whether the second Ethernet frame is a compressed packet, and a CID.

In an example, a header of the second Ethernet frame includes 3 bytes, where each byte includes 8 bits, totally 24 bits. The reserved bit occupies 1 bit, the indication indicating whether the second Ethernet frame is a compressed packet occupies 1 bit, and the CID occupies 22 bits. That is, the second information occupies 24 bits.

In another example, the header of the second Ethernet frame includes 2 bytes, where each byte includes 8 bits, totally 16 bits. The reserved bit occupies 1 bit, the indication indicating whether the second Ethernet frame is a compressed packet occupies 1 bit, and the CID occupies 14 bits. That is, the second information occupies 16 bits.

In a yet another example, the header of the second Ethernet frame includes 1 byte, where each byte includes 8 bits, totally 8 bits. The reserved bit occupies 1 bit, the indication indicating whether the second Ethernet frame is a compressed packet occupies 1 bit, and the CID occupies 6 bits. That is, the second information occupies 8 bits.

Optionally, the second Ethernet frame is a full packet or a compressed packet, and the header of the second Ethernet frame is a full header or a compressed header. The full header further includes other header information besides the second information, e.g., a source address, a destination address, or the like, where the other header information includes compressible information.

In the operations at 404, "the indication indicating whether the second Ethernet frame is a compressed packet" in the above second information is used to indicate that the second Ethernet frame is a full packet or a compressed packet.

At 406, the second communication device receives the second Ethernet frame.

At 408, according to the second information, the second communication device establishes a context and/or, transmits feedback for the second Ethernet frame.

In the implementation, when "the indication indicating whether the second Ethernet frame is a compressed packet" in the second information indicates that the second Ethernet frame is a full packet, the second communication device establishes the context and/or transmits the feedback for the second Ethernet frame. The feedback may be positive feedback.

The header of the first Ethernet frame further includes other header information since the header of the second Ethernet frame is a full header. The second communication device obtains the other header information, and according to the other header information, establishes the context and transmits the positive feedback for the second Ethernet frame. The positive feedback is used to trigger the first communication device to start switching from full packet transmission status to compressed packet transmission status.

When "the indication indicating whether the second Ethernet frame is a compressed packet" in the second information indicates that the second Ethernet frame is a compressed packet, the second communication device decompresses the second Ethernet frame, and/or, transmits the feedback. The feedback may be negative feedback if decompression fails.

It to be noted that, when UL and DL are both configured with EHC, or the EHC configured for the UL and the EHC configured for the DL both are disabled, values of ul-drb-ContinueEHC and dl-drb-ContinueEHC are the same, where ul represents uplink, dl represents downlink, drb represents a data radio bearer, and EHC represents Ethernet header compression.

Figure 5:
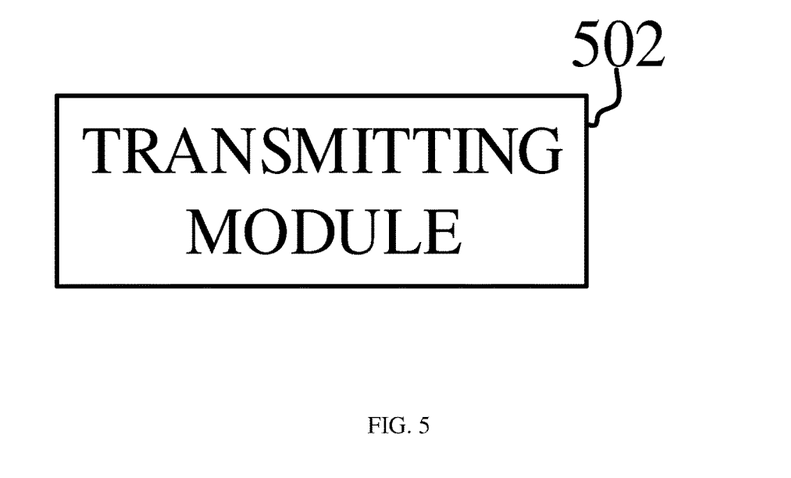
FIG. 5 is a block diagram illustrating an apparatus for Ethernet frame transmission provided in an exemplary implementation of the disclosure.

FIG. 5 is a block diagram illustrating an apparatus for Ethernet frame transmission provided in an exemplary implementation of the disclosure. The apparatus is applied to a compressor and includes a transmitting module 502. The transmitting module 502 is configured to transmit a first Ethernet frame, where a header of the first Ethernet frame carries first information, and the first information is used to indicate to a decompressor whether to perform context establishment and/or whether to perform feedback transmission.

In an example, the first information occupies 1 bit.

In an example, the first Ethernet frame is a full packet.

In an example, the header of the first Ethernet frame carries a full header.

In an example, the header of the first Ethernet frame carries second information besides the first information.

In an example, the second information includes a reserved bit, an indication indicating whether the first Ethernet frame is a compressed packet, and a CID.

In an example, the header of the first Ethernet frame includes 3 bytes, the first information occupies 1 bit, the reserved bit occupies 1 bit, the indication indicating whether the first Ethernet frame is a compressed packet occupies 1 bit, and the CID occupies 21 bits. Alternatively, the header of the first Ethernet frame includes 2 bytes, the first information occupies 1 bit, the reserved bit occupies 1 bit, the indication indicating whether the first Ethernet frame is a compressed packet occupies 1 bit, and the CID occupies 13 bits. Alternatively, the header of the first Ethernet frame includes 1 byte, the first information occupies 1 bit, the reserved bit occupies 1 bit, the indication indicating whether the first Ethernet frame is a compressed packet occupies 1 bit, and the CID occupies 5 bits.

In an example, the first information occupies 2 bits, where a first bit of the 2 bits is used to indicate to the decompressor whether to perform context establishment, and a second bit of the 2 bits is used to indicate to the decompressor whether to perform feedback transmission.

In an example, the transmitting module 502 is further configured to transmit a second Ethernet frame, where a header of the second Ethernet frame carries second information, and the second information includes: a reserved bit, an indication indicating whether the second Ethernet frame is a compressed packet, and a CID.

In an example, the header of the second Ethernet frame includes 3 bytes, the reserved bit occupies 1 bit, the indication indicating whether the second Ethernet frame is a compressed packet occupies 1 bit, and the CID occupies 22 bits. Alternatively, the header of the second Ethernet frame includes 2 bytes, the reserved bit occupies 1 bit, the indication indicating whether the second Ethernet frame is a compressed packet occupies 1 bit, and the CID occupies 14 bits. Alternatively, the header of the second Ethernet frame includes 1 byte, the reserved bit occupies 1 bit, the indication indicating whether the second Ethernet frame is a compressed packet occupies 1 bit, and the CID occupies 6 bits.

Figure 6:
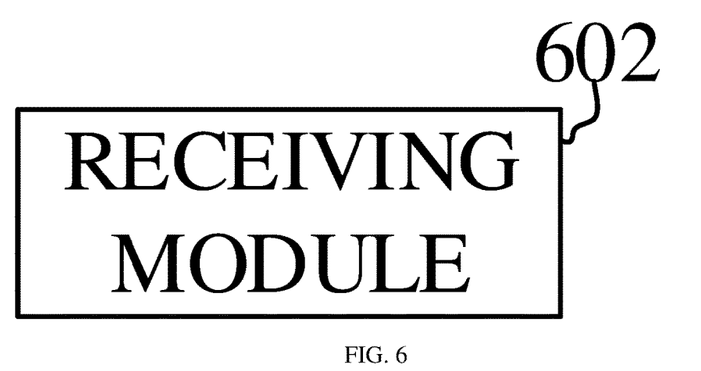
FIG. 6 is a block diagram illustrating an apparatus for Ethernet frame reception provided in an exemplary implementation of the disclosure.

FIG. 6 is a block diagram illustrating an apparatus for Ethernet frame reception provided in an exemplary implementation of the disclosure. The apparatus is applied to a decompressor and includes a receiving module 602. The receiving module 502 is configured to receive a first Ethernet frame, where a header of the first Ethernet frame carries first information, and the first information is used to indicate to the decompressor whether to perform context establishment and/or whether to perform feedback transmission.

In an example, the first information occupies 1 bit.

In an example, the first Ethernet frame is a full packet.

In an example, the header of the first Ethernet frame carries a full header.

In an example, the header of the first Ethernet frame carries second information besides the first information.

In an example, the second information includes a reserved bit, an indication indicating whether the first Ethernet frame is a compressed packet, and a CID.

In an example, the header of the first Ethernet frame includes 3 bytes, the first information occupies 1 bit, the reserved bit occupies 1 bit, the indication indicating whether the first Ethernet frame is a compressed packet occupies 1 bit, and the CID occupies 21 bits. Alternatively, the header of the first Ethernet frame includes 2 bytes, the first information occupies 1 bit, the reserved bit occupies 1 bit, the indication indicating whether the first Ethernet frame is a compressed packet occupies 1 bit, and the CID occupies 13 bits. Alternatively, the header of the first Ethernet frame includes 1 byte, the first information occupies 1 bit, the reserved bit occupies 1 bit, the indication indicating whether the first Ethernet frame is a compressed packet occupies 1 bit, and the CID occupies 5 bits.

In an example, the first information occupies 2 bits, where a first bit of the 2 bits is used to indicate to the decompressor whether to perform context establishment, and a second bit of the 2 bits is used to indicate to the decompressor whether to perform feedback transmission.

In an example, the receiving module 602 is further configured to receive a second Ethernet frame, where a header of the second Ethernet frame carries second information, and the second information includes: a reserved bit, an indication indicating whether the second Ethernet frame is a compressed packet, and a CID.

In an example, the header of the second Ethernet frame includes 3 bytes, the reserved bit occupies 1 bit, the indication indicating whether the second Ethernet frame is a compressed packet occupies 1 bit, and the CID occupies 22 bits. Alternatively, the header of the second Ethernet frame includes 2 bytes, the reserved bit occupies 1 bit, the indication indicating whether the second Ethernet frame is a compressed packet occupies 1 bit, and the CID occupies 14 bits. Alternatively, the header of the second Ethernet frame includes 1 byte, the reserved bit occupies 1 bit, the indication indicating whether the second Ethernet frame is a compressed packet occupies 1 bit, and the CID occupies 6 bits.

It to be noted that, the apparatus for Ethernet frame transmission and the apparatus for Ethernet frame reception provided in the above implementations are only illustrated with the above functional modules. In practice, the above functions may be allocated to and implemented by different functional modules as required. That is, an internal structure of a device may be divided into different functional modules to complete all or part of the functions illustrated above.

Figure 7:
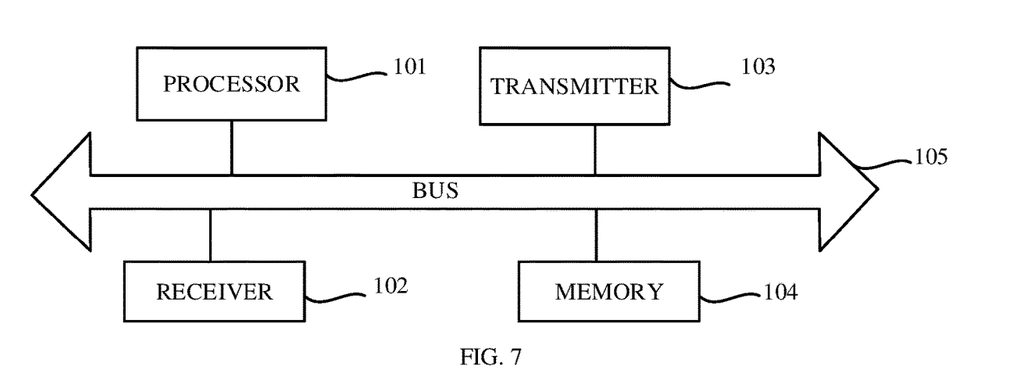
FIG. 7 is a schematic structural diagram illustrating a terminal provided in an exemplary implementation of the disclosure.

FIG. 7 is a schematic structural diagram illustrating a communication device provided in an exemplary implementation of the disclosure. The communication device includes a processor 101, a receiver 102, a transmitter 103, a memory 104, and a bus 105.

The processor 101 includes one or more processing cores and performs various functional applications and information processing by running software programs and modules.

The receiver 102 and the transmitter 103 can be implemented as a communication component, where the communication component may be a communication chip.

The memory 104 is coupled with the processor 101 via the bus 105.

The memory 104 is configured to store at least one instruction. The processor 101 is configured to execute the at least one instruction to implement the operations at each step in the above method implementations.

In addition, the memory 104 may be implemented by any type of a volatile or non-volatile storage device or a combination thereof. The volatile or non-volatile storage device includes but is not limited to: a magnetic disc, a compact disc (CD), an electrically erasable programmable read-only memory (EEPROM), an erasable programmable read-only memory (EPROM), a static random access memory (SRAM), a read-only memory (ROM), a magnetic memory, a flash memory, or a programmable read-only memory (PROM).

In an exemplary implementation, a computer-readable storage medium is further provided. The computer-readable storage medium is configured to store at least one instruction, at least one program, a code set, or an instruction set, where the at least one instruction, the at least one program, the code set, or the instruction set is loaded and executed by a processor to implement the method for Ethernet frame transmission and/or the method for Ethernet frame reception performed by the transmitting terminal provided in the foregoing method implementations.

It can understood by those of ordinary skill in the art that all or part of the steps in the foregoing implementations may be accomplished by hardware or a program to instruct associated hardware. The program may be stored in a computer-readable storage medium, which may include a ROM, a magnetic disc, a CD, and so on.

The above is only an optional implementation of the disclosure and is not intended to limit the disclosure. Any modification, equivalent arrangements, and improvement made within the spirit and principles of the disclosure shall be included in the scope of protection of the disclosure.

What is claimed is:

1. A method for Ethernet frame transmission, the method being applied to a compressor and comprising:
   transmitting a first Ethernet frame to a decompressor, a header of the first Ethernet frame carrying first information, the first information being used to indicate to the decompressor whether to perform context establishment,
   wherein the header of the first Ethernet frame carries a full header,
   wherein a first value of the first information indicates to perform context establishment, and
   wherein a second value of the second information indicates not to perform context establishment.

2. The method of claim 1, wherein the header of the first Ethernet frame carries second information besides the first information.

3. The method of claim 2, wherein
   the second information comprises: a reserved bit, an indication indicating whether the first Ethernet frame is a compressed packet, and a context identifier (CID); and
   on condition that uplink (UL) and downlink (DL) are both configured with Ethernet header compression (EHC), or the EHC configured for the UL and the EHC configured for the DL both are disabled, values of ul-drb-ContinueEHC and dl-drb-ContinueEHC are the same, where ul represents uplink, dl represents downlink, drb represents a data radio bearer, and EHC represents Ethernet header compression.

4. A method for Ethernet frame reception, the method being applied to a decompressor and comprising:
   receiving a first Ethernet frame transmitted by a compressor, a header of the first Ethernet frame carrying first information, the first information being used to indicate to the decompressor whether to perform context establishment,
   wherein the header of the first Ethernet frame carries a full header,
   wherein a first value of the first information indicates to perform context establishment, and
   wherein a second value of the second information indicates not to perform context establishment.

5. The method of claim 4, wherein the header of the first Ethernet frame carries second information besides the first information.

6. The method of claim 5, wherein
   the second information comprises: a reserved bit, an indication indicating whether the second Ethernet frame is a compressed packet, and a context identifier (CID); and
   on condition that uplink (UL) and downlink (DL) are both configured with Ethernet header compression (EHC), or the EHC configured for the UL and the EHC configured for the DL both are disabled, values of ul-drb-ContinueEHC and dl-drb-ContinueEHC are the same, where ul represents uplink, dl represents downlink, drb represents a data radio bearer, and EHC represents Ethernet header compression.

7. A compressor comprising:
   a transceiver configured to transmit a first Ethernet frame to a decompressor, a header of the first Ethernet frame carrying first information, the first information being used to indicate to the decompressor whether to perform context establishment,
   wherein the header of the first Ethernet frame carries a full header,
   wherein a first value of the first information indicates to perform context establishment, and
   wherein a second value of the second information indicates not to perform context establishment.

8. The compressor of claim 7, wherein the header of the first Ethernet frame carries second information besides the first information.

9. The compressor of claim 8, wherein
   the second information comprises: a reserved bit, an indication indicating whether the first Ethernet frame is a compressed packet, and a context identifier (CID); and
   on condition that uplink (UL) and downlink (DL) are both configured with Ethernet header compression (EHC), or the EHC configured for the UL and the EHC configured for the DL both are disabled, values of ul-drb-ContinueEHC and dl-drb-ContinueEHC are the same, where ul represents uplink, dl represents downlink, drb represents a data radio bearer, and EHC represents Ethernet header compression.

10. A decompressor comprising:
    a transceiver configured to receive a first Ethernet frame from a compressor, a header of the first Ethernet frame carrying first information, the first information being used to indicate to the decompressor whether to perform context establishment,
    wherein the header of the first Ethernet frame carries a full header,
    wherein a first value of the first information indicates to perform context establishment, and
    wherein a second value of the second information indicates not to perform context establishment.

11. The decompressor of claim 10, wherein the header of the first Ethernet frame carries second information besides the first information.

12. The decompressor of claim 11, wherein
    the second information comprises: a reserved bit, an indication indicating whether the second Ethernet frame is a compressed packet, and a context identifier (CID); and
    on condition that uplink (UL) and downlink (DL) are both configured with Ethernet header compression (EHC), or the EHC configured for the UL and the EHC configured for the DL both are disabled, values of ul-drb-ContinueEHC and dl-drb-ContinueEHC are the same, where ul represents uplink, dl represents downlink, drb represents a data radio bearer, and EHC represents Ethernet header compression.

\* \* \* \* \*